United States Patent
Bauer

[15] 3,678,500

[45] July 18, 1972

[54] ANALOG DIGITAL CONVERTER

[72] Inventor: Douglas M. Bauer, Danvers, Mass.

[73] Assignee: General Electric Company

[22] Filed: Aug. 4, 1970

[21] Appl. No.: 60,885

[52] U.S. Cl. ..............340/347 AD, 340/347 NT, 235/150.52

[51] Int. Cl. ..............H03k 13/02

[58] Field of Search..............340/347 NT, 347 CC, 347 AD; 235/184, 150.52, 150.3; 324/99 D

[56] References Cited

UNITED STATES PATENTS

| | | | |
|---|---|---|---|
| 3,517,339 | 6/1970 | Hubbard et al. | 340/347 NT |
| 3,354,453 | 11/1967 | Hibbits et al. | 340/347 NT |
| 3,439,271 | 4/1969 | Metcalf et al. | 340/347 NT |
| 3,541,320 | 11/1970 | Beall | 340/347 NT |

*Primary Examiner*—Maynard R. Wilbur
*Assistant Examiner*—Joseph M. Thesz, Jr.
*Attorney*—I. David Blumenfield, Robert P. Cogan, Frank L. Neuhauser, Oscar B. Waddell and Joseph B. Forman

[57] ABSTRACT

An analog to digital converter system is provided for producing an output frequency indicative of the ratio of first and second direct current signals. A summing circuit has a first direct current voltage connected to its non-inverting input and provides an output to an integrator. The integrator output is coupled to and controls a voltage controlled oscillator which provides a train of output pulses. The second direct current voltage is coupled to a frequency to direct current converter connected in a feedback loop between the oscillator and an inverting input of the summing network. The output of the summing network is thus nulled at a pulse rate proportional to the ratio of the voltages. The output of the voltage controlled oscillator may then be supplied to a digital readout device to provide a visual indication of the ratio of the first and second voltages.

4 Claims, 3 Drawing Figures

INVENTOR

Douglas M. Bauer

BY Joseph B. Forman

His ATTORNEY

Patented July 18, 1972

3,678,500

2 Sheets-Sheet 2

INVENTOR

Douglas M. Bauer

BY Joseph B. Forman

His ATTORNEY

ANALOG DIGITAL CONVERTER

BACKGROUND OF THE INVENTION

This invention relates to analog digital converter systems. More specifically, it relates to analog to digital converters producing a digital output indicative of the ratio of first and second analog signals.

An analog to digital converter is a circuit which provides a digital output comprising a pulse train having a pulse rate or frequency indicative of the level of a direct current voltage input. The well-known voltage controlled oscillator has been employed as an analog to digital converter. Very briefly, a voltage controlled oscillator usually includes a capacitor which charges to a set voltage level to cause further circuitry to discharge the capacitor. An output pulse is produced when the capacitor discharges. Since the charging rate of the capacitor is proportional to the level of the input voltage, the output frequency of the voltage controlled oscillator is indicative of the magnitude of the input voltage. While forms of the voltage controlled oscillator are extremely accurate and stable, the relation between the input voltage and the output frequency may not be exactly linear. Therefore, voltage controlled oscillators have been combined with further circuitry to form systems comprising linear analog to digital converters.

In such arrangements, some form of processing of digital output is utilized to modify the analog input in order to maintain linearity. Usually, this involves some sort of feedback loop. Thus, in one such linearized analog to digital converter, the modified input signal is applied to an integrator which provides an output to a voltage controlled oscillator. The output of the voltage controlled oscillator is supplied to a digital readout device which counts the number of output pulses over a successive, equal time periods. However, even in such arrangements, it is possible for the timing circuitry, which determines the period of the digital readout means to drift in frequency so that errors may be introduced. In addition, since the accuracy of the conversion performed is dependent primarily on the accuracy of the feedback loop, the accuracy of the converter is dependent upon circuit parameters, thus providing a further source of error in the digital readout. Furthermore, such prior art circuits usually measured just one voltage and were incapable of measuring ratio of first and second input voltages.

SUMMARY OF THE INVENTION

It is therefore an object of the present invention to provide an analog to digital converter producing a highly linear output and which may be used to provide an output frequency indicative of the ratio of first and second direct current voltage inputs.

It is a more specific object of the present invention to provide an analog to digital converter of the type described in which a negative feedback loop is coupled from the output of a voltage controlled oscillator to the input of the analog to digital converter to provide a direct current voltage feedback signal having a magnitude related to the level of one of the two input voltages.

It is also an object of the present invention to provide an analog to digital converter of the type described in which an error signal indicative of the relative level of first and second input voltages is produced and in which the error signal is utilized to produce an output pulse train having a pulse rate proportional to their ratio.

It is the further object of the present invention to provide an analog to digital converter of the type described which includes a feedback loop whose accuracy is independent of circuit parameters.

It is another object of the present invention to provide an analog to digital converter producing a digital readout, the accuracy of which is unaffected by drift in the timing means controlling the period of the readout means.

It is a more specific object of the present invention to provide an analog to digital converter of the type described in which errors produced in the feedback loop and the timing circuitry for the digital readout means are self-cancelling.

Other objects and advantages of the invention will become apparent as the description thereof proceeds.

Briefly stated, in accordance with the present invention a linear analog to digital converter is provided which is capable of producing a digital output indicative of the ratio of first and second direct current voltage inputs. A first direct current input voltage is connected to a non-inverting terminal of a summing network which has its output connected to an integrator circuit. The integrator provides an input signal to a voltage controlled oscillator which produces a variable frequency output signal. A frequency to direct current converter is connected in a feedback loop from the output of the voltage controlled oscillator to an inverting input of the summing circuit. A second direct current voltage is applied to the converter in the feedback loop to control its maximum voltage output. The output of the voltage controlled oscillator may be gated for successive time periods into a digital readout means, and a common clock source may be used to time the operation of both the frequency to direct current converter and the timing circuitry of the digital readout means.

BRIEF DESCRIPTION OF THE DRAWINGS

The circuitry through which the foregoing objects are achieved and the novel features of the present invention are pointed out with particularity in the claims forming the concluding portion of the specification. The invention, both as to its organization and manner of operation, may be further understood by reference to the following description taken in connection with the following drawings.

Of the drawings.

DESCRIPTION OF THE PREFERRED EMBODIMENTS

Figure 1:
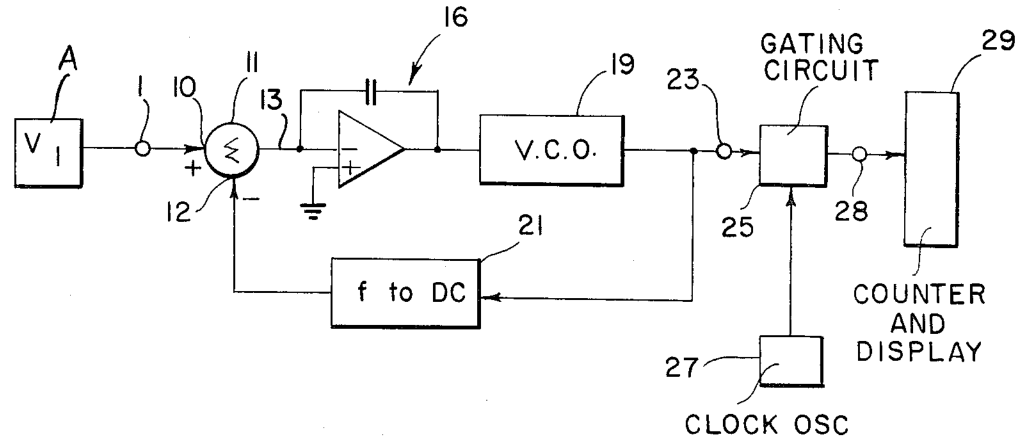
FIG. 1 is a block diagram of an analog to digital converter constructed in a manner prescribed by the present invention.

FIG. 1 illustrates an analog to digital converter for producing an output frequency indicative of a voltage $V_1$. The input voltage $V_1$ from a source A is supplied to input terminal 1 of the analog to digital converter and is impressed on non-inverting input terminal 10 of a summing network 11, which also has a corresponding inverting input terminal 12. The summing network may conveniently comprise a differential input operational amplifier or a differential input chopper-stabilized amplifier of the type which are well known in the art. One form of chopper-stabilized amplifier is illustrated and explained at page 647 of Millman and Taub, *Pulse, Digital and Switching Waveforms* McGraw-Hill Book Company, New York 1965). Another suitable chopper-stabilized amplifier for use in this application is disclosed in application Ser. No. 739,070 now U.S. Pat. No. 3,564,288 by Douglas M. Bauer filed June 21, 1968 and assigned to the General Electric Company, which is also the assignee of the present application.

The output signal from network 11 appearing at output terminal 13 is applied to an integrating circuit 16, comprising an operational amplifier having a capacitor in its feedback loop. The output of integrator 16 is applied to a voltage controlled oscillator 19. The voltage controlled oscillator is a circuit which produces an output frequency preferably a pulse train the rate of which is indicative of the direct current voltage applied to its input. Various forms of voltage controlled oscillators are well known in the art. One suitable voltage controlled oscillator for use in this application, which is extremely accurate and reliable, is disclosed in application Ser. No. 852,042 now U.S. Pat. No. 3,621,469, filed Aug. 21, 1969 by Douglas M. Bauer and also assigned to the General Electric Company, assignee of the present application.

In order to provide for a linear relationship between output pulse rate and input signal level, a negative feedback loop is connected between the output of voltage controlled oscillator 19 and inverting input 12. The feedback loop includes a frequency to direct current converter 21 which produces an analog feedback signal proportional to the frequency of the output of voltage controlled oscillator 19. Summing network 11 compares the input voltage $V_1$ with the feedback signal to provide a difference or error signal at its output terminal 13. The error signal is integrated by the integrator 16. The output of the integrator 16, and therefore, the output of the voltage controlled oscillator 19 changes until the error is reduced to zero. The output signal $f_{out}$ from VCO 19 is then counted to produce a digital readout. Thus, oscillator output terminal 23 is connected to a gating circuit 25 which has an output terminal 28 connected to a counter and digital readout circuit 25. Gating circuit 25 establishes the duration of the time period during which the oscillator output pulses are counted and is synchronized and controlled from a clock source 27. The counter and digital readout unit 29 may be any of the many well-known counter readout means, such as visual display tubes, etc. to provide an output display indicative of the pulses supplied from the voltage controlled oscillator during the interval controlled by the gating circuit 25.

Figure 2:
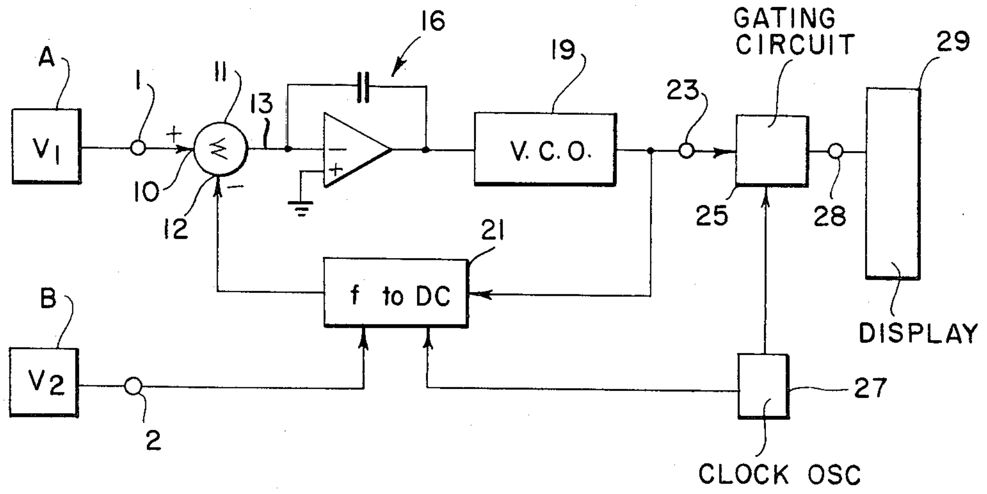
FIG. 2 is a block diagram of an analog to digital converter constructed in accordance with the present invention which operates to produce an output frequency indicative of the ratio of first and second input voltages.

The circuit of FIG. 2 incorporates the A/D converter of FIG. 1 in a more sophisticated arrangement to provide an analog to digital converter which produces a digital output indicative of the ratio of voltages $V_1$ and $V_2$, $V_1$ and $V_2$ may be supplied from any one of many different direct current voltage sources. For example, they may be the low-level outputs from thermocouples or similar sensors. In FIG. 2, the same reference numerals are used to denote components corresponding to those in FIG. 1.

In the circuit of FIG. 2, a second D.C. signal $V_2$ is applied from a source of direct current voltage B. This signal is applied to frequency to direct current converter 21 to provide a direct current reference voltage source for converter 21. The output from clock source 27 is also connected to current converter 21 to synchronize its operation. Converter 21, presently to be described in detail, is one whose operation is synchronized by a clock source and one which utilizes a direct current reference voltage. Output pulses from the voltage controlled oscillator 19 are also applied to converter 21 which contains logic circuitry to be described in connection with FIG. 3 which produces direct current pulses of uniform width for each output pulse of the voltage controlled oscillator 19. These direct current pulses control the average level of the direct current reference voltage $V_2$ which is applied to summing network 12. A suitable frequency converter for this purpose is disclosed in Ser. No. 852,041 now U.S. Pat. No. 3,601,707, filed Aug. 21, 1969, also by Douglas M. Bauer and assigned to the General Electric Company, assignee of the present invention.

At the equilibrium condition of the loop of FIG. 2, which consists of the voltage controlled oscillator 19 and converter 21, the relationship of the loop parameters is such that:

$$f_{out} V_2 K = V_1, \text{ or}$$
$$f_{out} K = V_1/V_2$$

where $K$ is a constant of proportionality and $f_{out}$ is the pulse rate of the VCO.

Thus, the output pulse rate at the terminal 23 is proportional to the ratio of the two input voltages $V_1$ and $V_2$.

The $f_{out}$ signal appearing at the terminal 23 is gated through the gating circuit 25 into unit 29 for a fixed period of time to provide a digital readout. Since the same clock oscillator 27 is used to control both converter 21 and gating circuit 25, any errors caused by drift in the clock frequency will be self-cancelling. Thus, no error will be present in the readout supplied by the counter and display unit 29.

Figure 3:
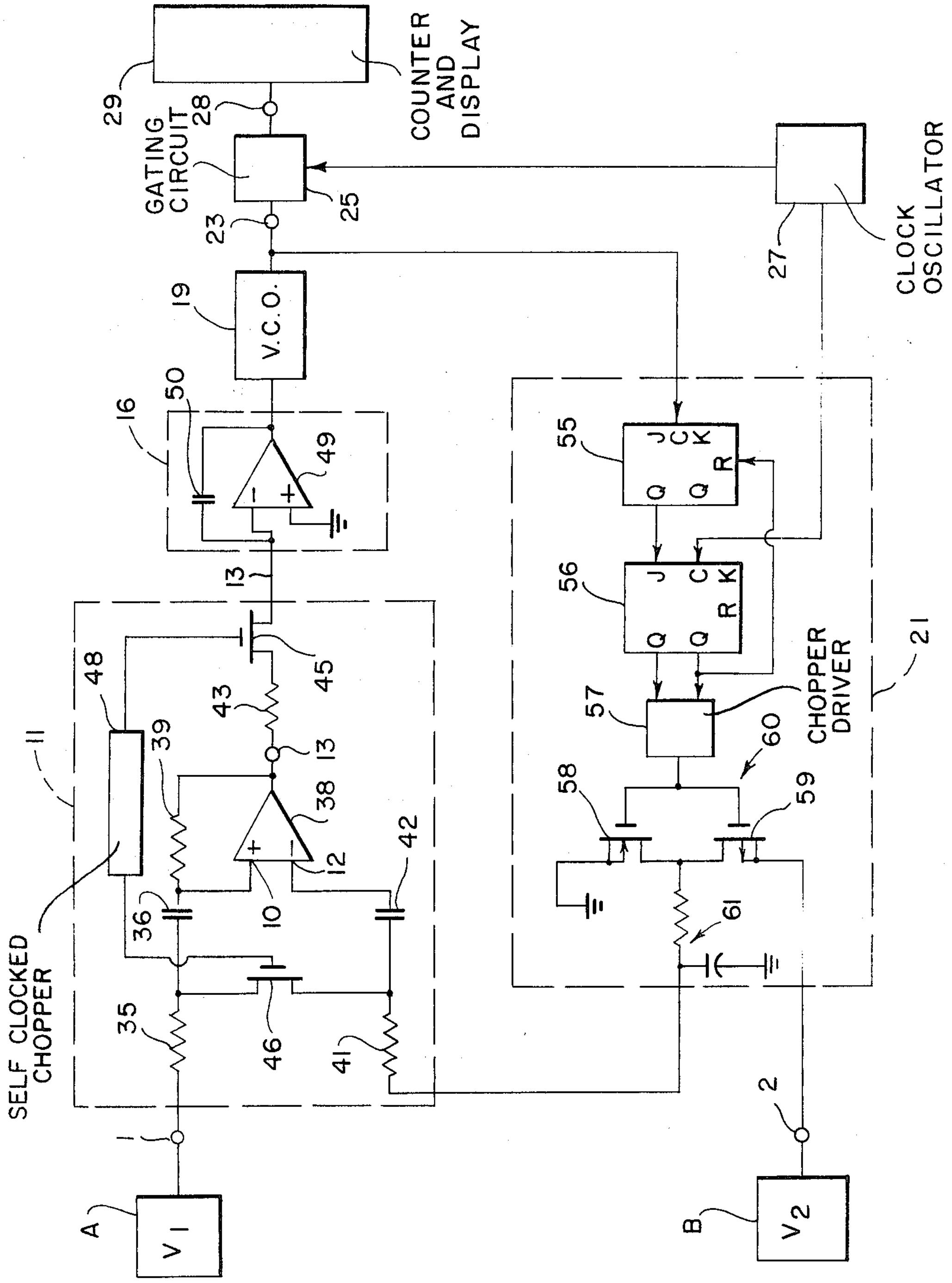
FIG. 3 is a partial schematic and partially block diagram showing certain circuit features of FIG. 2 in greater detail.

As seen in FIG. 3, which shows the circuit details of the arrangement of FIG. 2, the voltage $V_1$ from source A is connected to A/D converter input terminal 1 and thence to summing network 11. In FIG. 3, a chopper-stabilized amplifier is used as the summing network. The voltage $V_1$ is coupled from the terminal 1 by a resistor 35 and capacitor 36 to the non-inverting input terminal 10 of an alternating current operational amplifier 38 having a feedback resistor 39 connected from its output to the input 10. The voltage from converter 21 which is responsive to $V_2$ and $f_{out}$ is coupled by a resistor 41 and capacitor 42 to inverting input terminal 12 of operational amplifier 38. Output terminal 13 of operational amplifier 38 is connected through a coupling resistor 43 and the source-drain circuit of a field effect transistor 45 to the integrator circuit 16. A field effect transistor 46 is connected with its source-drain circuit across the input terminals 10 and 12 of operational amplifier 38. The gate electrodes of both the transistors 45 and 46 are connected to a self-clocked chopper circuit shown in block diagram form at 48, which periodically short circuits the inputs to the operational amplifier 38 to provide an alternating current input into the terminals 10 and 12 and also periodically energizes transistor 45 for synchronously demodulating the output of the alternating current operational amplifier 38. The operation of chopper-stabilized amplifier summing circuit is explained more fully in the previously cited application Ser. No. 739,070 now U.S. Pat. No. 3,564,288 by Bauer, which is hereby incorporated by reference. The output of summing network 11 is connected to the inverting input terminal of an operational amplifier 49, the non-inverting terminal of which is grounded. A capacitor 50 is connected from the output of the operational amplifier 49 to its inverting input to perform integration in a well-known manner, and provides an output to the voltage controlled oscillator 19.

Frequency to direct current inverter 21 contains a first bistable logic circuit 55, which takes the form of a well-known J–K flip-flop. The clock terminal of flip-flop 55 denoted as C in FIG. 3 is connected to the output of the voltage controlled oscillator 19 while its Q terminal is connected to a J terminal of a second bistable logic circuit 56, which is also a J–K flip-flop. The $\overline{Q}$ terminal of J–K flip-flop 56 is connected to a reset terminal R of J–K flip-flop 55. The $\overline{Q}$ and Q output terminals of J–K flip-flop 56 are also connected to a chopper driver shown in block diagram form at 57. Clock terminal C of J–K flip-flop 56 is connected to an output of clock oscillator 27. Briefly stated, J–K flip-flops 55 and 56 operate to produce an output pulse of uniform duration in response to each pulse from VCO 19 received at the C terminal of J–K flip-flop 55. When a pulse is received at clock terminal C of J–K flip-flop 55, the voltage level at its Q terminal enables J–K flip-flop 56 by raising the voltage level at its J terminal to the logic 1 state. Flip-flop 56, when enabled by flip-flop 55, produces an output when a clock pulse from clock oscillator 27 is received at the C terminal, a condition which is terminated at the beginning of the next clock pulse. When the output pulse from J–K flip-flop 56 is initiated, J–K flip-flop 55 is reset by virtue of the feedback from $\overline{Q}$ terminal of flip-flop 56 to the reset terminal of flip-flop 55 so that this operation may be repeated for the next output pulse from voltage controlled oscillator 19. The output from J–K flip-flop 56 determines the state of the chopper driver circuit 57, which could for example, comprise a transistor biased to act as a switch. Chopper driver circuit 57 provides an output of a one level during an output pulse of the J–K flip-flop 56, and an output of another level in the absence of such a pulse.

The output of chopper driver 57 controls a chopper circuit 60 and is connected to the gate terminals of a pair of field effect transistors 58 and 59 which have their source-drain circuits connected in series between the input terminal 2 and a point of common potential, such as ground, for example. Transistor 58 is turned on and transistor 59 biased off when there is no output pulse applied to driver circuit 57. Transistor 59 is turned on and transistor 58 is turned off, on the other hand, when a pulse is applied to driver circuit 57. Thus, transistor 59 is turned on for a fixed interval for each output pulse from voltage controlled oscillator 19. When the transistor 59 is on, the voltage $V_2$ from source B is coupled via the terminal 2 to a filter circuit 61 which is connected to the coupling resistor 41. As fewer pulses are applied from voltage controlled oscillator 19 to converter 21, transistor 58 remains on for a longer time so that a lower average voltage is applied to summing circuit 11. A higher output pulse rate from voltage controlled oscillator 19 results in a higher average voltage being coupled to the inverting input of the summing circuit 11. Thus, chopper circuit 60 provides an output voltage which is proportional to the frequency $f_{out}$ times the voltage $V_2$. A fuller discussion of the frequency to direct current converter 21 is included in the previously mentioned patent application, Ser. No. 852,041 now U.S. Pat. No. 3,601,707 which is hereby incorporated by reference.

As described above, as the error output of summing circuit 11 drops toward zero, $f_{out}$ pulses are supplied from the terminal 23 to the gating circuit 25, which may comprise any convenient gating means, such as a NAND gate and counter, for example. The gating circuit 25 is synchronized by the clock oscillator 27 and its output is coupled by a terminal 28 to the counter and display device 29.

The accuracy of the frequency $f_{out}$ is primarily dependent on the accuracy of the feedback loop comprising the frequency to direct current converter 21. Since the feedback loop depends solely for its accuracy upon the clock oscillator 27, its accuracy is not affected by circuit parameters. Furthermore, since the clock oscillator 27 controls both the frequency to direct current converter 21 and the gating circuit 25, which provides output pulses to the unit 29, any errors caused due to drift in the frequency of the clock oscillator 27 are self-cancelling.

The present invention thus provides an extremely simple and highly reliable linear analog to digital converter capable of providing a digital readout indicative of the ratio between first and second direct current voltage inputs. Many forms of voltage controlled oscillator may be used. Any known frequency to direct current converter 21 may be used providing that it is synchronized by a clock and depends for its maximum level of output on the magnitude of one of the two input voltages. Thus, innumerable modifications of the circuitry disclosed will be readily apparent to those skilled in the art to produce an analog to digital converter constructed in accordance with the present invention.

What is claimed as new and desired to be secured by Letters Patent of the United States is:

1. An analog to digital converter comprising in combination:

a. a summing network having a non-inverting input for connection to a first source of direct current voltage, an inverting input and an output;

b. an integrator circuit having an input and an output, said input being coupled to the output of said summing network;

c. a voltage controlled oscillator having an input coupled to the output of said integrator, and an output providing a pulse train having a repetition frequency rate indicative of the output of said summing network, and d. a frequency to direct current converter having an input coupled to the output of said voltage controlled oscillator, and an output coupled to the inverting input of said summing network, said frequency to direct current converter including switching means coupled between a second direct current voltage source and said inverting terminal, said switching means being controlled in response to the pulse train from said voltage controlled oscillator to provide a voltage to said inverting input proportional to the product of the level of the second direct current voltage source and the pulse train frequency applied to the input of said frequency to direct current converter, whereby the repetition rate of the pulses produced by said voltage controlled oscillator is proportional to the ratio of the first direct current voltage to the second direct current voltage.

2. An analog to digital converter according to claim 1 in which said switching means comprises a chopper.

3. An analog to digital converter according to claim 1 wherein said frequency to direct current converter comprises first and second bistable logic circuits, each normally in a first state and capable of assuming first and second states, said first bistable logic circuit having an input connected to the output of said voltage controlled oscillator and an output connected to a first input of said second bistable logic circuit, said second bistable logic circuit having a second input coupled to a clock oscillator providing clock pulses, the occurrence of a pulse from said voltage controlled oscillator changing the state of said first bistable logic circuit and enabling said second bistable logic circuit to change state in response to successive clock pulses said second bistable logic circuit being connected to reset said first bistable logic circuit upon said second bistable logic circuit being switched from its second to its first state, and means coupling an output from one of said bistable logic circuits to said switching means.

4. An analog to digital converter according to claim 3 further comprising a gating circuit having an input connected to the output of said voltage controlled oscillator and an output for connection to a counter and digital display, said gating circuit being synchronized by said clock oscillator.

* * * * *